United States Patent [19]
Veith et al.

[11] Patent Number: 5,434,542
[45] Date of Patent: Jul. 18, 1995

[54] HIGH-FREQUENCY OSCILLATOR FOR 1.6 TO 3 GHZ FREQUENCY RANGE

[75] Inventors: Peter E. Veith; Janos Gila, both of Vienna, Austria

[73] Assignee: Siemens Aktiengesellschaft Oesterreich, Wien, Austria

[21] Appl. No.: 316,643

[22] Filed: Sep. 30, 1994

Related U.S. Application Data

[63] Continuation of PCT/AT93/00033, March 2, 1993.

[30] Foreign Application Priority Data

Apr. 3, 1992 [AT] Austria .................. A692/92

[51] Int. Cl.$^6$ .............................. H03B 5/18
[52] U.S. Cl. ..................... 331/99; 331/117 D; 331/177 V
[58] Field of Search ............. 331/96, 99, 107 SL, 331/117 D, 177 V

[56] References Cited

U.S. PATENT DOCUMENTS

| | | | |
|---|---|---|---|
| 4,709,409 | 11/1987 | Ma et al. | 331/107 DP |
| 4,990,865 | 2/1991 | Martheli | 331/99 |
| 4,990,866 | 2/1991 | Martheli | 331/99 |
| 5,187,451 | 2/1993 | Nakamoto et al. | 331/99 |

FOREIGN PATENT DOCUMENTS 0267100  5/1988  European Pat. Off. .
2189101 10/1987  United Kingdom .

Primary Examiner—Siegfried H. Grimm
Attorney, Agent, or Firm—Herbert L. Lerner; Laurence A. Greenberg; Werner H. Stemer

[57] ABSTRACT

A high-frequency oscillator is provided for a frequency range of 1.6 to 3 GHz. An oscillator stage includes an oscillator transistor and a voltage-controlled resonator unit. A buffer stage is connected at an output of the oscillator stage. The resonator unit includes an open resonator in the form of an etched structure with a wavelength which is shorter than lambda/4 (where lambda is an oscillator length). The resonator unit includes a voltage-controlled variable-capacitance diode, and a resonator terminal is connected between the voltage-controlled variable-capacitance diode of the resonator unit and the oscillator transistor of the oscillator stage. The resonator is preferably an open microstrip resonator, and the stages are disposed in a standardized housing in SMD (surface mounted device) technology.

8 Claims, 2 Drawing Sheets

HIGH-FREQUENCY OSCILLATOR FOR 1.6 TO 3 GHZ FREQUENCY RANGE

CROSS-REFERENCE TO RELATED APPLICATION

This is a continuation of international application No. PCT/AT93/00033, filed Mar. 2, 1993.

Background of the Invention

1. Field of the Invention

The invention relates to an oscillator for a frequency of 1.6 to 3 GHz with a voltage-controlled resonator unit of an oscillator stage and with a following buffer stage.

An oscillator of this kind for a frequency of 1.6 to 3 GHz can be used for instance in portable, mobile or stationary communications systems. One example is remote control systems or measuring systems, particularly at frequencies of 2.4 to 2.5 GHz.

For this difficult frequency range of 1.6 to 3 GHz, voltage controlled oscillators are known, with the use of special, highly sophisticated materials and components, such as thin-film technology, thick-film technology, ceramics technology, porcelain capacitors, etc. In particular, complicated and expensive calibration networks are necessary for stabilization purposes.

2. Description of the Related Art

In U.S. Pat. No. 4,990,865 issued Mar. 14, 1990 to M. Martheli, an oscillator transistor in a collector circuit is presented, in which a tuning network in its emitter branch is necessary for stabilization.

In U.S. Pat. No. 4,990,866 issued Mar. 14, 1990 to M. Martheli, there is disclosed a complicated tuning network with three serial variable-capacitance diodes and several tuning elements in a resonator unit for an oscillator stage. The housing configuration of the variable-capacitance diodes is designed for frequencies lower than the oscillator frequency, so that their parasitic inductances are not negligible at the rated oscillator frequency.

SUMMARY OF THE INVENTION

It is accordingly an object of the invention to provide a high-frequency oscillator, which overcomes the hereinaforementioned disadvantages of the heretofore-known devices of this general type and which provides an oscillator that is usable particularly at a frequency of 1.6 to 3 GHz. A configuration in a standard housing and economical mass production are to be attained. It is a further object to provide a structure which is economically feasible in the context of mobile telephones or other communications systems. With the foregoing and other objects in view there is provided, in accordance with the invention, a high-frequency oscillator for a frequency of 1.6 to 3 GHz, comprising:

an oscillator stage having an output, and a voltage-controlled resonator unit disposed in the oscillator stage; and a buffer stage connected at the output of the oscillator stage;

the oscillator stage including an oscillator transistor;

the resonator unit including an open resonator in the form of an etched structure with a wavelength shorter than lambda/4 (where lambda is an oscillator wavelength);

the resonator unit including a voltage-controlled variable-capacitance diode, and a resonator terminal connected between the voltage-controlled variable-capacitance diode of the resonator unit and the oscillator transistor of the oscillator stage.

In other words, the objects of the invention are attained in an oscillator for a frequency of 1.6 to 3 GHz with a voltage-controlled resonator unit of an oscillator stage and with a following buffer stage, in which the resonator of the resonator unit is realized as an etched structure, in the form of an open resonator with a wavelength shorter than lambda/4. The resonator terminal of the resonator is coupled on the one hand to a voltage controlled variable-capacitance diode of the resonator unit and on the other hand to an oscillator transistor of the oscillator stage.

The basic concept of the invention is that an open resonator with a wavelength shorter than lambda/4 (in the form of an etched structure) has such a slight frequency deviation that advantageously, a special frequency calibration is not needed. By way of example, the etched structure of the resonator may be provided as a microstrip, or as a coplanar structure or as a slot structure, for instance, or in other words may be made by either the monolithic technique or a hybrid technique.

By means of the embodiment as a resonator shorter than lambda/4, a distributed resonator function is achieved. Components in the resonator unit, for instance, which are designed for a lower frequency can contribute decisively, with their parasitic properties, to the resonator function. Economical components can thus be used. Parasitic inductances of bonding wires in the variable-capacitance diode housing, and a parasitic capacitance of the housing structure of the variable-capacitance diode housing, and parasitic inductances of the capacitors are especially suitable in this respect.

It is especially advantageous that in this distributed resonator function, because of the parasitic properties of economical components, the requisite stability is attained without having to use an expensive resonator network with special tuning functions. This simple arrangement with an open resonator with a wavelength shorter than lambda/4 thus offers major advantages, for instance in mass production, since particularly in the resonator unit the calibration functions are not necessary. This simple oscillator is especially advantageous in mass production for frequencies of 1.6 to 3 GHz, compared with other known oscillators in this frequency range, which is of interest for example for mobile telephones.

In accordance with an additional feature of the invention, the resonator is an open microstrip resonator with a wavelength shorter than lambda/4.

Advantageously, constructing the oscillator by the SMD technique, for instance, is facilitated thereby, because for the open microstrip resonator with a wavelength below lambda/4, a structure is provided that is quite simple to produce.

In accordance with an added feature of the invention, the oscillator stage further includes a feedback-type microstrip having a first end and a second end, and wherein the oscillator transistor is a bipolar transistor connected in a collector circuit; the oscillator transistor having a base, an emitter and a collector; the base of the oscillator transistor being connected to the resonator terminal; the emitter of the oscillator transistor being connected to the first end of the feedback-type microstrip of the oscillator stage; and the collector of the oscillator transistor being connected to the buffer stage through the output of the oscillator stage.

An oscillator can be embodied in which a bipolar transistor of the oscillator stage is provided as the oscillator transistor in a collector circuit. The following features are required in this context:

the base of the oscillator transistor is connected to the resonator terminal;

the emitter of the oscillator transistor is connected to a first end of a feedback-type microstrip of the oscillator stage. The second end of the microstrip, in the open structure of the feedback-type microstrip is series-connected to a reference potential via a first coil of the oscillator stage and a first resistor of the oscillator stage;

the collector of the oscillator transistor is connected to the buffer stage.

The frequency band in question is considered very difficult. In that respect, a simple oscillator stage can be used, in that a frequency-determining element in the form of the open feedback-type microstrip is disposed in the emitter branch. Due to the slight frequency deviation, special, expensive tuning process can be eliminated. Because of the distributed resonator function, an especially simple oscillator stage results, with good stability, so that the oscillator can be constructed without a tuning function. The feedback-type microstrip, because of its open form of embodiment, causes only an adequately slight deviation in frequency. Further advantages for attaining a simple configuration are attained because especially as a result of its open form of embodiment, a direct voltage connection exists for the feedback-type microstrip. The reference potential mentioned herein is preferably ground potential. A housing of the oscillator may provide the common reference potential.

In accordance with a further feature of the invention, the feedback-type microstrip is an open microstrip, and the oscillator stage further includes a first coil connected to the second end of the feedback-type microstrip, and a first resistor connected between the first coil and reference potential.

A distributed capacitive feedback is operative in the feedback-type microstrip, as a result of the direct connection with the emitter. At the oscillator frequency, the feedback-type microstrip forms a negative resistance as seen from the base.

Advantageously, therefore, it is a frequency-determining feature that the open resonator with a wavelength shorter than lambda/4—in a preferred embodiment it is a microstrip resonator—and the feedback-type microstrip cooperate via the oscillator transistor. At an intended frequency range for the oscillator frequency, the microstrip resonator should have a comparatively low impedance, in order to achieve high quality. The structures of the two microstrips can advantageously be produced in a simple way, with the requisite accuracy, by simply etching their microstripline form. In this case, the oscillator frequency is now affected primarily only by tolerance values of the components used, but they do not have a serious effect on the resonator frequency.

In accordance with again an additional feature of the invention, the oscillator further includes: a second resistor connected between the collector and the base of the oscillator transistor, and a third resistor connected between the base of the oscillator transistor and reference potential; a second coil connected between the collector of the oscillator transistor and a supply voltage terminal of the oscillator stage; a filter capacitor connected between the voltage supply terminal of the oscillator stage and reference potential; and first, second and third resistor means for defining a non-overdriven operating mode of the oscillator transistor.

In other words, the oscillator may be embodied with the following features:

the collector is connected to the base via a second resistor of the oscillator stage;

the base is connected to the reference potential via a third resistor of the oscillator stage;

the collector is connected to a voltage supply of the oscillator stage via a second coil of the oscillator stage;

the voltage supply point is connected to the reference potential via a filter capacitor of the oscillator stage; and wherein the first, second and third resistors provide for the non-overdriven operating mode of the oscillator transistor.

The oscillator transistor may be configured in a simple configuration. By simple means and at minimal effort and expense, a frequency stability can be achieved, especially for allowable temperature fluctuations, or fluctuations in the supply voltage.

Other advantages result from the fact that it is not necessary to provide an active current source for the supply voltage. A low supply voltage is possible. This is a major advantage in mobile communications systems, for instance.

In accordance with again an added feature of the invention, the variable-capacitance diode has a control voltage terminal and a reference potential terminal connected to reference potential, and the oscillator further comprises: a coupling capacitor connected between the resonator terminal and the control voltage terminal of the variable-capacitance diode; the resonator unit including a control voltage input and a resistor connected between the control voltage input and the control voltage terminal of the variable-capacitance diode; and a filter capacitor connected between the control voltage input and reference potential.

In particular, the operating point of the oscillator transistor should be adjusted for a non-overdriven operating mode of the oscillator transistor. This is done in a simple way by means of the first, second and third resistors. To attain the simple arrangement, the fact is advantageously exploited that the emitter is series-connected by direct voltage, via the feedback-type microstrip, to the first coil and the first resistor.

This series-connected configuration in the emitter branch may for instance be effected in such a way that the emitter is connected to the feedback-type microstrip, which is connected to the first resistor. A serial configuration in the emitter branch in the sense of transposing the first coil and the first resistor, is also possible, but sometimes less favorable.

Other advantages are attained from the fact that the collector is connected directly to the second coil. At the intended oscillator frequency, the collector has low impedance, while the base and emitter have at least comparatively high impedance. This is favorable upon uncoupling from the following buffer stage. Additional advantages are thus gained for the power output of the oscillator stage of the oscillator.

This relatively simple configuration is especially favorable in the oscillator stage because of the distributed resonator function. Particularly for the resistors and coils, economical components can be used, and their parasitic properties can be exploited as well. This applies for instance to the voltage divider for the base as well, i.e. to the second and third resistor. A high-frequency decoupling from the base voltage can be dispensed with, or may also be provided at least in part in conjunction with parasitic capacitances of coils.

An oscillator can be embodied with the following features:

the resonator terminal is connected via a coupling capacitor of the resonator unit to a control voltage terminal of the variable-capacitance diode, whose other end is connected to the reference potential;

a control voltage input of the resonator unit is connected to the control voltage terminal via a resistor of the resonator unit;

the control voltage input is connected to the reference potential via a filter capacitor of the resonator unit.

A particular advantage of this simple configuration is the distributed resonator function. An economical component can be used for the variable-capacitance diode. Parasitic properties of the variable-capacitance diode can be utilized, in particular parasitic inductances, for instance in the form of a parasitic series oscillator circuit provided in the variable-capacitance diode. That circuit should in particular serve the purpose of compensation, given the distributed resonator function, for the intended resonator wavelength shorter than lambda/4.

The coupling capacitor serves the purpose of direct voltage disconnection between the variable-capacitance diode and the resonator. In other words, if the oscillator transistor for instance is connected directly to the resonator, the coupling capacitor should serve the purpose of direct voltage disconnection between the variable-capacitance diode and the resonator. For instance, if this direct voltage disconnection is not provided in this way or is not necessary in this way, then the coupling capacitor can be omitted, for instance by connecting the variable-capacitance diode directly to the resonator. It is possible, but it may not be very favorable in certain instance, given the requisite direct voltage disconnection between the variable-capacitance diode and the oscillator transistor, for the coupling capacitor to be disposed between the resonator and the oscillator transistor, for the sake of direct voltage disconnection with high-frequency coupling of the resonator and oscillator transistor. In addition, a further coupling capacitor may be provided for coupling the resonator to the variable-capacitance diode.

In an advantageously simple way, the resonator of the resonator unit and the filter capacitor form a filter function from the variable-capacitance diode to the control voltage terminal.

Further advantages result from the fact that economical SMD (surface mounted device) components, for instance, can be used, whose housing arrangement and connection wires located in them are designed for lower frequencies in comparison with the oscillator frequency, so that at the oscillator frequency, non-negligible parasitic inductances and capacitances can be utilized for the distributed resonator function of the oscillator. Particularly as a result of the advantageously low number of components required, estimating the parasitic effects is facilitated.

It may be pointed out in particular that the combination of characteristics disclosed for the oscillator stage and its resonator unit, for the difficult frequency range from 1.6 to 3 GHz, results in a surprisingly simple configuration. Expensive tuning networks and tuning functions are not provided, in that with a distributed resonator function, in an advantageously simple way, the open microstrip resonator which is shorter than lambda/4 cooperates with the open feedback-type microstrip at minimal effort and expense. For these two striplines, an adequately low frequency deviation in production can be attained so that tuning functions can be dispensed with. The open feedback-type microstrip, functioning as a distributed capacitor, is provided for direct voltage series connection in the emitter circuit, so that an advantageously minimal influence on the replicability of the oscillator frequency exists. Excellent oscillator properties with high output level and high replicability of the oscillator frequency are attainable, using economical active and passive components. With high efficiency and a low supply voltage and with the elimination of any frequency calibration, only minimal effort and expense are needed for frequency stabilization in terms of allowable fluctuations in the temperature and supply voltage. In the non-overdriven operating mode of the oscillator transistor, an active current source, for instance in the form of a current supply transistor in the collector branch, is not necessary. Thus a low supply voltage is also possible. A 3V battery voltage, for instance, may already be adequate in some cases.

In accordance with again a further feature of the invention, the buffer stage includes a GaAs transistor amplifier operated in non-overdriven operating mode. Advantageously, the oscillator stage is so high-power that in the following buffer stage, in a non-overdriven operating mode, a GaAs transistor amplifier can be used, and the excellent properties of its large signal behavior can be exploited.

Special advantages are attained in a circuit-specific selection of the active components, in particular, because especially low-noise operation is attainable, particularly by making use of the non-overdriven operating mode.

In accordance with a concomitant feature of the invention, the oscillator includes a housing enclosing the oscillator stage with the resonator unit and the buffer stage, each of the stages having components mounted in SMD technique.

In other words, an oscillator can be embodied which is disposed in a standardized housing by means of the SMD technique. In an advantageous way, with good stability of the oscillator, so few components are needed that the oscillator can be disposed in a standard housing, particularly by means of the SMD (surface mounted device) technique. A simple oscillator stage with a simple resonator unit is provided, by means of which an existing power output is attainable in stable fashion, so that one buffer stage suffices. Other advantages result from the fact that economical SMD components in particular can be used, since a distributed resonator function is provided by utilizing the parasitic properties of these components.

It should be especially pointed out that this indicated combination of characteristics for the oscillator for the difficult frequency range from 1.6 to 3 GHz produces a surprisingly simple arrangement, which, due to its small dimensions, can be accommodated in a standard housing. Because all calibration functions can be dispensed with, simple mass-production replicability is achieved.

Inexpensive components can be used.

At high efficiency, for example of more than 15%, and with high temperature stability, operation with a low supply voltage, for instance down to 3 V, is made possible.

With low phase-to-noise values and high output power, for example 20 mW, a wide tuning range exists, which in some cases may even be below or above the difficult frequency range from 1.6 to 3 GHz.

Other features which are considered as characteristic for the invention are set forth in the appended claims.

Although the invention is illustrated and described herein as embodied in a high-frequency oscillator, it is nevertheless less not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
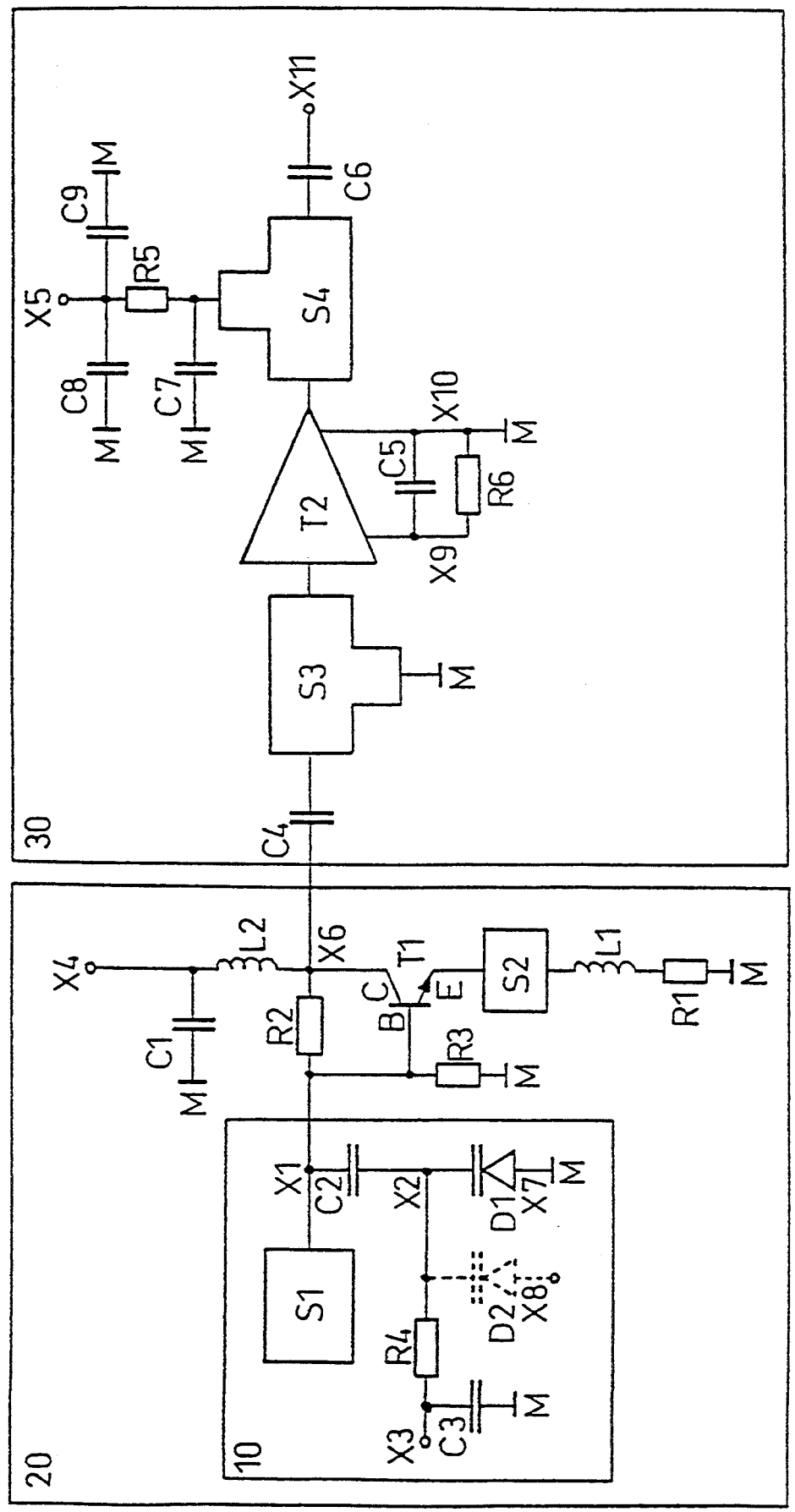
FIG. 1 shows a circuit diagram of the oscillator.

Referring now to the figures of the drawing in detail, the description of the exemplary embodiment will utilize the following reference numerals:

| | |
|---|---|
| 10 | resonator unit |
| 20 | oscillator stage |
| 30 | buffer stage |
| S1 | resonator, e.g. a microstrip resonator with a wavelength shorter than lambda/4 (where lambda is an oscillator wavelength) |
| S2 | open feedback-type microstrip |
| S3 | uncoupling stripline |
| S4 | output stripline |
| D1, D2 | variable-capacitance diode |
| X1 | resonator terminal |
| X2 | control voltage terminal of the variable-capacitance diode, in particular cathode terminal of the variable-capacitance diode |
| X3 | control voltage input of the resonator unit |
| X4 | voltage supply terminal of the oscillator stage |
| X5 | voltage supply terminal of the buffer stage |
| X6 | uncoupling point of the oscillator stage |
| X7, X8 | anode terminal of the variable-capacitance diode |
| X9 | feedback terminal of the GaAs transistor amplifier |
| X10 | reference potential terminal of the GaAs-transistor amplifier |
| X11 | output of the buffer stage |
| M | reference potential |
| T1 | oscillator transistor of the oscillator stage, in particular a bipolar transistor |
| B | base of the oscillator transistor |
| E | emitter of the oscillator transistor |
| C | collector of the oscillator transistor |
| T2 | GaAs transistor amplifier of the buffer stage |
| R1, R2, R3 | resistor of the oscillator stage |
| R4 | resistor of the resonator unit |
| R5, R6 | resistor of the buffer stage |
| L1, L2 | coil of the oscillator stage |
| C1 | filter capacitor of the oscillator stage |
| C2 | coupling capacitor of the resonator unit |
| C3 | filter capacitor of the resonator unit |
| C4 | uncoupling capacitor of the buffer stage |
| C5 | feedback capacitor of the buffer stage |
| C6 | output capacitor of the buffer stage |
| C7, C8, C9 | filter capacitor of the buffer stage |
| Q | housing |

The exemplary embodiment illustrated in the diagram of FIG. 1, which pertains to an oscillator for a frequency in the frequency range from 1.6 to 3 GHz, includes a resonator unit 10 of an oscillator stage 20, which is followed by a buffer stage 30.

In the resonator unit 10, an open microstrip resonator S1 with a wavelength shorter than lambda/4 (where lambda is an oscillator wavelength) is provided, with a resonator terminal X1. The resonator terminal X1 is connected to a control voltage terminal X2 of a variable-capacitance diode D1, via a coupling capacitor C2 of the resonator unit 10. The control voltage terminal X2 serves as a cathode terminal X2 of the variable-capacitance diode D1. An anode terminal X7 of the capacitance diode D1 is connected to a reference potential or ground potential M.

By way of example, the variable-capacitance diode D1 may be provided as a component that contains two variable-capacitance diodes D1, D2 with an identical control terminal X2 for both variable-capacitance diodes D1, D2. In that case it is possible to only use one diode D1, while the other variable-capacitance diode D2 is not used. An anode terminal X8 of the variable-capacitance diode D2 that is not used should not be connected in this case, or in other words should remain open.

The control voltage terminal X2 is connected to a control voltage input X3 of the resonator unit 10, via a resistor R4 of the resonator unit 10. The control voltage input X3 is connected to the reference potential M, via a filter capacitor C3 of the resonator unit 10. At the control voltage input X3, a control voltage can be input, by means of which the frequency of the voltage controlled oscillator is controlled, in that a capacitance for the variable-capacitance diode D1 is controlled by means of the input control voltage.

As a part of the oscillator stage 20, the resonator unit 10 is connected at the resonator terminal X1 to a base B of an oscillator transistor T1 of the oscillator stage 20. An emitter E of the oscillator transistor T1 is connected to one end of an open feedback-type microstrip S2, whose other end is connected to a first inductance or first coil L1, which is followed by a first resistor R1, connected to the reference potential M of the oscillator stage 20.

A collector C of the oscillator transistor T1 is connected to an uncoupling point X6 of the oscillator stage 20. The collector C is connected via a second coil L2 of the oscillator stage 20 to a voltage supply terminal X4 of the oscillator stage 20. The voltage supply terminal X4 is connected to the reference potential M via a filter capacitor C1 of the oscillator stage 20. A supply voltage of the oscillator stage 20 can be input at the voltage supply terminal X4.

The base B of the oscillator transistor T1 is connected to the collector C of the oscillator transistor T1 via a second resistor R2 of the oscillator stage 20. The base B of the oscillator transistor T1 is connected to the reference potential M via a third resistor R3 of the oscillator stage 20.

For uncoupling purposes in the buffer stage 30, an uncoupling capacitor C4 of the buffer stage 30 is provided in combination with an uncoupling stripline S3 of the buffer stage 30, which, in a closed form of embodiment of the uncoupling stripline S3, is connected to the reference potential M. The uncoupling stripline S3 acts as an input for a GaAs transistor amplifier T2 of the buffer stage 30. A feedback terminal X9 of the GaAs transistor amplifier T2 is connected to a reference potential terminal X10 of the GaAs transistor amplifier T2, via a parallel circuit of a feedback capacitor C5 of the buffer stage 30 and a resistor R6 of the buffer stage 30. The reference potential terminal X10 of the GaAs transistor amplifier T2 is connected to the reference potential M.

At the output of the GaAs transistor amplifier T2, an output stripline S4 of the buffer stage 30 is provided, which is connected to an output point X11 of the buffer stage 30 via an output capacitor C6 of the buffer stage 30. The output stripline S4 is connected to the reference potential M via a filter capacitor C7 of the buffer stage 30. Via a further resistor R5, the output stripline S4 is connected to a voltage supply terminal X5 of the buffer stage 30. On a case-by-case basis, it may be provided that the resistor R5 is omitted or in other words not provided, by connecting the output stripline S4 to the voltage supply terminal X5. The voltage supply terminal X5 is connected to the reference potential M via a second filter capacitor C8 of the buffer stage 30 and via a third filter capacitor C9. A supply voltage for the buffer stage 30 can be input at the voltage supply terminal X5.

An oscillator signal generated by the oscillator can be taken off at the output terminal X11 of the buffer stage 30.

As the variable-capacitance diode D1, one of two variable-capacitance diodes of an SMD (surface mounted device) component, Siemens BBY51, may be used, for example.

As the oscillator transistor T1, an SMD component, Siemens BFR181, can be used for instance, which includes a bipolar transistor.

As the GaAs transistor amplifier T2, an SMD component, Siemens CF750, can be used for instance.

The oscillator may for instance be constructed by the SMD technique, using an epoxy printed wiring board that is 0.8 mm thick.

Figure 2:
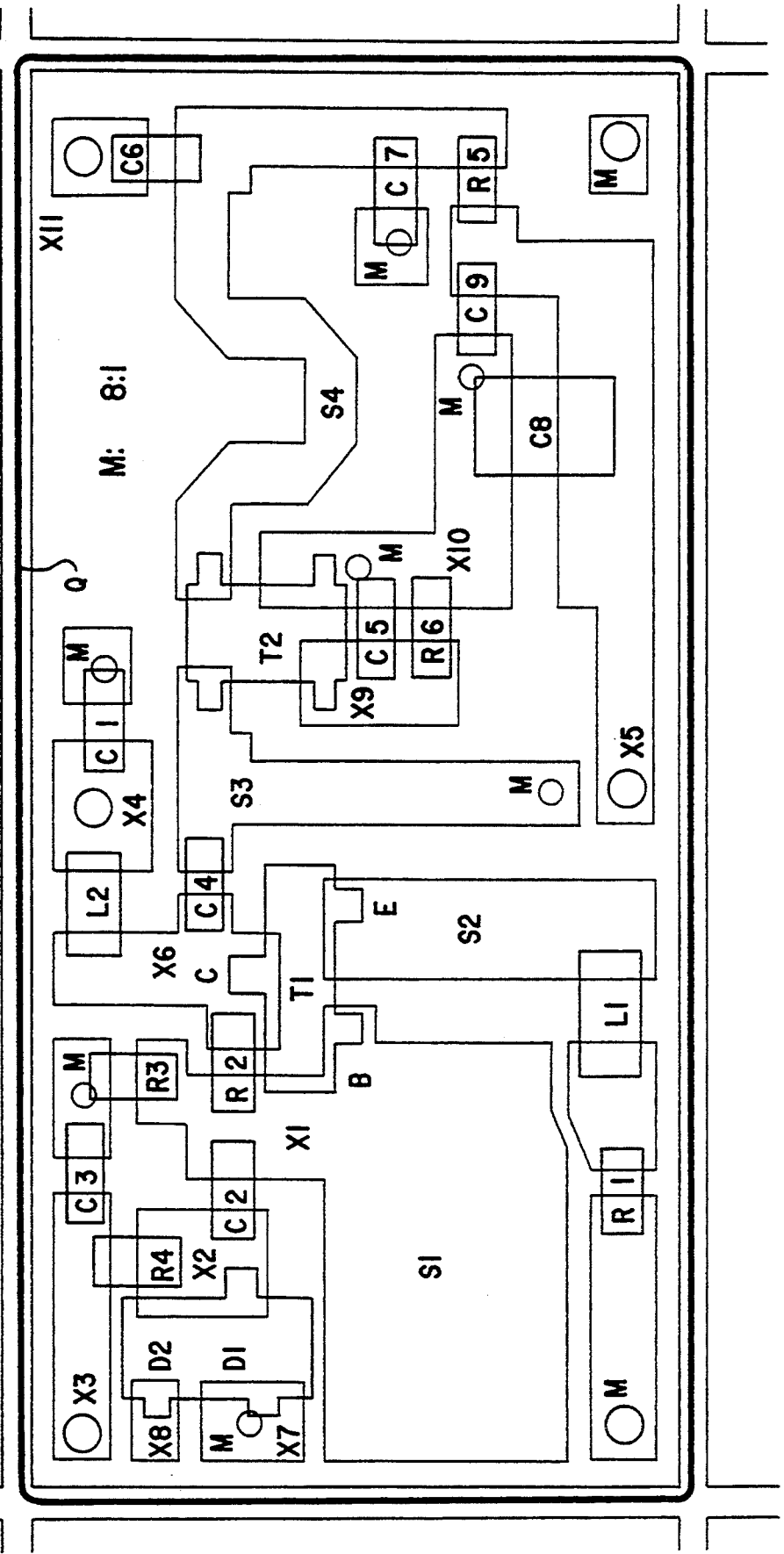
FIG. 2 shows a mounting surface of a printed wiring board for SMD components.

A thus-constructed oscillator may for instance be disposed in a Koto-6 housing made by the Koto Electric Company. FIG. 2 shows an exemplary embodiment for a printed wiring board of a thus-constructed oscillator.

The drawing, on a scale of approximately 8:1, shows the component side of the printed wiring board with its conductor tracks, on which the SMD (surface mounted device) components are secured by the SMD technique. Especially the contours of the conductor tracks are shown as thin lines. The contours of the intended SMD components are shown as heavy lines. A housing Q (e.g. the Koto-6 housing made by Koto Electric Company) is provided along the outer heavy line. The Siemens BBY51 SMD component is preferably used as the variable-capacitance diode component, with two variable-capacitance diodes D1, D2. The Siemens BFR181 SMD component is intended in particular as the oscillator transistor T1. The Siemens CF750 SMD component is intended in particular as the GaAs transistor amplifier T2. The printed wiring board shown is made of an epoxy material with a thickness of 0.8 mm, and it is conductive on its back side.

Six terminal pins are provided, shown in the drawing as circles drawn in heavy lines.

At the points marked by circles drawn in fine lines, the conductor track shown on the component side is passed through the printed wiring board and connected conductively to the conductive backside thereof. The conductive backside of the printed wiring board forms the ground or reference potential M. The reference potential M is added both at the terminal pin shown at bottom left in the drawing and the terminal pin shown at bottom right in the drawing. These two terminal pins are intended to be conductively connected to the conductive backside of the printed wiring board. The control voltage for the voltage controlled oscillator is supplied at the terminal pin X3 shown at the upper left corner in FIG. 2. The supply voltage of the oscillator stage is supplied at the terminal pin X4 shown at top center in the figure. The supply voltage for the buffer stage is supplied at the terminal pin X5 shown at bottom center of the figure. The oscillator signal is taken off from the terminal pin X11 shown at the upper right in the figure.

To explain the mode of operation of the oscillator, it should be noted that the oscillator transistor T1 is disposed in a collector circuit. A low-impedance uncoupling takes place via the uncoupling capacitor C4. The emitter E of the oscillator transistor T1 is connected to an open feedback-type microstrip S2. The result is a negative resistance, viewed from the standpoint of the base B of the oscillator transistor T1, for a broad frequency range. In terms of direct voltage, the operating point of the oscillator transistor T1 is adjusted by means of the resistors R1, R2 and R3, such that a non-overdriven mode of operation of the oscillator transistor T1 is provided. High-frequency decoupling of the oscillator transistor T1 is provided by means of the coils L1 and L2 and with the aid of the filter capacitor C1, The base B of the oscillator transistor T1 is connected at the resonator terminal X1 to a resonator unit that is to be electrically tuned. This unit comprises an open microstrip resonator S1 which is shorter than lambda/4 and is connected to the variable-capacitance diode D1 via a coupling capacitor C2. This brings about the generation of oscillations at a characteristic frequency of this resonator unit. Via the resistor R4 and the filter capacitor C3, which act as an RC filter, a control voltage can be input at the control voltage input X3. The control voltage serves the purpose of frequency-determining control of this resonator unit, in that the capacitance of the variable-capacitance diode D1 is controlled in accordance with the control voltage. The anode terminal X8 of the variable-capacitance diode D2 remains open, so that the variable-capacitance diode D2 in particular is then not used.

Some of the energy oscillating in this oscillator stage is taken over by the GaAs transistor amplifier T2, via the uncoupling capacitor C4 and the uncoupling stripline S3. It is then available, buffered and amplified, at the output of the amplifier T2, from where it is adapted in terms of impedance by the output stripline S4. The resistors R4 and R5 determine the operating point of the GaAs transistor amplifier T2, in particular for a non-overdriven mode of operation. Uncoupling functions, decoupling functions and filter functions are brought about in conjunction with the capacitors C5, C6, C7, C8, C9.

In an oscillator constructed in this way by the SMD technique, i.e. no ceramics technology, bonding or thin-film technology is employed, and it can be constructed using conventional materials and components, surprisingly excellent oscillating properties can be observed. The oscillating frequency is highly replicable, especially in a frequency range of from 1.6 to 3.0 GHz. With good thermal properties and low sensitivity to fluctuations in the supply voltage, a supply voltage of 3.0 V, for instance, can be provided at the voltage supply terminals X4, X5. At high efficiency of the oscillator, high output power can be drawn at the output terminal X11. Particularly based on the non-overdriven mode of operation of the oscillator stage and buffer stage, a low side band noise level can be maintained in the output signal.

This economical design of the oscillator is attained particularly because the standardized and parasitic properties of the conventional SMD components are actually utilized. This applies in particular to a serial parasitic inductance of the chip terminals of an economical variable-capacitance diode D1, which is normally excluded from use in such a high frequency range.

It should be noted in particular that the open microstrip resonator S1 which is shorter than lambda/4 on the one hand and the open feedback-type microstrip S2 on the other are not connected to the reference potential M. In particular, this makes for high replicability, in accordance with low frequency deviation for these two striplines. In the etching process, the contours for these two striplines can be reproduced sufficiently accurately. As a result of this the special advantages in terms of economy of the oscillator are attained. In particular, economical SMD components can be used, which normally are not rated for an oscillator with an oscillator frequency in the range from 1.6 to 3 GHz, for instance.

Thus in an oscillator for a frequency of 1.6 to 3 GHz with a voltage controlled resonator unit of an oscillator stage and with a following buffer stage, an open microstrip resonator which is shorter than lambda/4 is used in combination with an open feedback-type microstrip in the emitter branch of a collector circuit of a non-overdriven oscillator transistor. The resonator is coupled in particular to parasitic oscillator circuits of a variable-capacitance diode. An especially simple and robust circuit for this problematic frequency range is achieved, with high output power. It is possible to dispose the circuitry in SMD technique in a standard housing without special calibration functions, and in particular by mass production.

We claim:

1. A high-frequency oscillator for a frequency of 1.6 to 3 GHz, comprising:
   an oscillator stage having an output, and a voltage-controlled resonator unit disposed in said oscillator stage; and
   a buffer stage connected at said output of said oscillator stage;
   said oscillator stage including an oscillator transistor;
   said resonator unit including an open resonator in the form of an etched structure with a wavelength shorter than lambda/4 (where lambda is an oscillator wavelength);
   said resonator unit including a voltage-controlled variable-capacitance diode, and a resonator terminal connected between said voltage-controlled variable-capacitance diode of said resonator unit and said oscillator transistor of said oscillator stage.

2. The oscillator according to claim 1, wherein said resonator is an open microstrip resonator with a wavelength shorter than lambda/4.

3. The oscillator according to claim 1, wherein said oscillator stage further includes a feedback-type microstrip having a first end and a second end, and wherein said oscillator transistor is a bipolar transistor connected in a collector circuit; said oscillator transistor having a base, an emitter and a collector;
   said base of said oscillator transistor being connected to said resonator terminal;
   said emitter of said oscillator transistor being connected to said first end of said feedback-type microstrip of said oscillator stage; and
   said collector of said oscillator transistor being connected to said buffer stage through said output of said oscillator stage.

4. The oscillator according to claim 3, wherein said feedback-type microstrip is an open microstrip, and said oscillator stage further includes a first coil connected to said second end of said feedback-type microstrip, and a first resistor connected between said first coil and reference potential.

5. The oscillator according to claim 3, further comprising:
   a second resistor connected between said collector and said base of said oscillator transistor, and a third resistor connected between said base of said oscillator transistor and reference potential;
   a second coil connected between said collector of said oscillator transistor and a supply voltage terminal of said oscillator stage;
   a filter capacitor connected between said voltage supply terminal of said oscillator stage and reference potential; and
   first, second and third resistor means for defining a non-overdriven operating mode of said oscillator transistor.

6. The oscillator according to claim 1, wherein said variable-capacitance diode has a control voltage terminal and a reference potential terminal connected to reference potential, and the oscillator further comprises:
   a coupling capacitor connected between said resonator terminal and said control voltage terminal of said variable-capacitance diode;
   said resonator unit including a control voltage input and a resistor connected between said control voltage input and said control voltage terminal of said variable-capacitance diode; and
   a filter capacitor connected between said control voltage input and reference potential.

7. The oscillator according to claim 1, wherein said buffer stage includes a GaAs transistor amplifier operated in non-overdriven operating mode.

8. The oscillator according to claim 1, which further comprises a housing enclosing said oscillator stage with said resonator unit and said buffer stage, each of said stages having components mounted in SMD (surface mounted device) technique.

* * * * *